United States Patent
Zoels et al.

(10) Patent No.: US 8,957,723 B2
(45) Date of Patent: Feb. 17, 2015

(54) APPARATUS AND METHOD FOR POWER SWITCH HEALTH MONITORING

(75) Inventors: Thomas Alois Zoels, Bayern (DE); Alvaro Jorge Mari Curbelo, Bavaria (DE)

(73) Assignee: General Electric Company, Schenectady, NY (US)

( * ) Notice: Subject to any disclaimer, the term of this patent is extended or adjusted under 35 U.S.C. 154(b) by 47 days.

(21) Appl. No.: 13/492,947

(22) Filed: Jun. 11, 2012

(65) Prior Publication Data

US 2013/0328596 A1  Dec. 12, 2013

(51) Int. Cl.
*H03K 17/14* (2006.01)

(52) U.S. Cl.
USPC ......... 327/378; 327/108; 327/83; 324/762.09

(58) Field of Classification Search
CPC .................. H03K 19/00361; H03K 19/00315; H03K 19/0013; H03K 19/00384; H03K 17/145; H04L 25/028; H04L 25/0272; H03F 3/72
USPC .................. 327/108–112, 378, 83, 512, 513; 324/762.09; 326/82, 83; 374/163, 170, 374/179, 182, 183
See application file for complete search history.

(56) References Cited

U.S. PATENT DOCUMENTS

| 5,039,941 | A * | 8/1991 | Castro ...................... 324/762.09 |
| 6,405,154 | B1 * | 6/2002 | Ryan .............................. 702/183 |
| 8,008,953 | B1 * | 8/2011 | Brumett et al. ................ 327/109 |
| 8,299,767 | B1 * | 10/2012 | Tuozzolo et al. ............. 323/277 |
| 2006/0267621 | A1 * | 11/2006 | Harris et al. ................... 324/765 |
| 2009/0219049 | A1 * | 9/2009 | Meagher et al. .............. 324/769 |
| 2011/0278918 | A1 * | 11/2011 | Shindo et al. ................. 307/9.1 |

FOREIGN PATENT DOCUMENTS

DE  102005045957 A1  11/2006

OTHER PUBLICATIONS

Search Report and Written Opinion from corresponding PCT/US2013/040273 dated Jul. 16, 2013.

* cited by examiner

*Primary Examiner* — Lincoln Donovan
*Assistant Examiner* — Thomas Skibinski
(74) *Attorney, Agent, or Firm* — GE Global Patent Operation; John A. Kramer

(57) ABSTRACT

A method includes obtaining a standard value for a characteristic of a power switch and obtaining a measured value of the characteristic, via a gate drive unit connected to a gate terminal of the power switch. The method also includes determining a health state of the power switch by comparing the measured value to the standard value of the characteristic.

15 Claims, 6 Drawing Sheets

$$\int_0^{t\_on} I_g \, df = \int_{Vgc\_off=-1.4V}^{Vgc\_on=-12V} C_{miller}(V_{cg}) \, dV_{cg} + \int_{Vge\_off=-15V}^{Vge\_on=+15V} C_{ge}(V_{ge}, V_{gc\_off}) \, dV_{ge}$$

APPARATUS AND METHOD FOR POWER SWITCH HEALTH MONITORING

BACKGROUND

1. Technical Field

Embodiments of the invention relate generally to power converters. Other embodiments relate to power switch health monitoring.

2. Discussion of Art

Trains typically feature a number of cars that are pushed or pulled by a locomotive. The locomotive has traction wheels engaged with the track. In modern designs, electric wheel motors drive the traction wheels. The electric wheel motors are powered via electrical distribution from one or more engine-driven generators housed within the locomotive. The traction wheels and wheel motors can be reversibly configured, to also act as brakes for slowing the locomotive.

Similarly, in the mining industry, off-highway vehicles ("OHVs") usually employ electrically motorized wheels for propelling or retarding the vehicle. In particular, OHVs typically include a large horsepower diesel engine in conjunction with an alternator, a main traction inverter, and a pair of wheel drive assemblies housed within the rear tires of the vehicle. The diesel engine is directly associated with the alternator such that the diesel engine drives the alternator. The alternator powers the main traction inverter, in which semiconductor power switches commutate the alternator output current to provide electrical power to electric drive motors of the two wheel drive assemblies.

In both locomotive and OHV applications, solid state power converters are used to provide high voltage current from the generators or alternators to the wheel motors. Such power converters include inductive coils to step down the voltage as well as semiconductor power switches to commutate the current. Although the above-described applications are typical, it will be appreciated that power converters can be used in many other settings.

Generally, operation of a power converter is accomplished by applying alternately two different gate voltage levels to individual semiconductor power switches via corresponding gate drive units. It is a known problem that power semiconductor devices, i.e., "power switches," are subject to cyclic thermal stresses. While forward biased, each semiconductor conducts significant current at a relatively small voltage drop across the device. Despite the relatively low voltage across the forward-biased semiconductors, resistive heating nonetheless occurs. When forward bias or gate voltage is removed, each semiconductor ceases to conduct. Thus, in the absence of excessive leakage current, ungated power switches should cool toward ambient temperature.

Although durability is a consideration in semiconductor design, electrical design constraints entail that the various layers of the power switches are fabricated from materials having differing thermal properties; in particular, differing coefficients of thermal expansion. Accordingly, over time, thermal stress can cause a mechanical failure such as delamination, debonding of terminals, or fatigue cracking. Thermal stress also can cause an electrochemical failure such as current filamenting and Kirkendall void formation.

Operational stressors such as thermal cycling limit the useful lifetime of a power switch due to degradation of switch health through debonding or delamination. If switch lifetime is not accurately known, it will be replaced either too early, which leads to unnecessary costs and interference with desired operation, or too late, following a failure in operation. The actual remaining lifetime of a switch is hard to predict without measurement information. Typically, measurements used for predicting lifetime are taken only during shutdown or maintenance cycling of the electronic system, e.g., power converter, etc., in which a power switch is installed. As will be appreciated, shutdown or maintenance cycling interferes with desired operation.

Therefore, it is desirable to accurately determine the remaining lifetime of a power switch in operation.

BRIEF DESCRIPTION

In one embodiment, a method includes obtaining a standard value for a characteristic of a power switch and obtaining a measured value of the characteristic, via a gate drive unit connected to a gate terminal of the power switch. The method also includes determining a health state of the power switch based on a comparison of the measured value to the standard value of the characteristic. In another embodiment, the health state is periodically determined, and a health monitoring signal (containing information of the health state) is transmitted for use in controlling the power switch, generating a signal (to an operator or otherwise) indicating the power switch should be replaced, and/or the like.

In another embodiment of the invention, a gate drive unit includes an output stage configured to deliver gate voltage to a power switch, a sensor module configured to obtain a measured value of a characteristic of the power switch, and a controller configured to determine a health state of the power switch based on a comparison of the measured value to a standard value of the characteristic. In another embodiment, the controller is configured to periodically determine the health state, and may be further configured to control the power switch based on the health state, transmit a health monitoring signal (containing information of the health state) indicating (or otherwise for use in determining) that the power switch should be replaced, and/or the like.

Another embodiment of the invention is a power converter. The power converter includes a plurality of power switches, and a plurality of gate drive units. The gate drive units include respective output stages connected to deliver gate voltages to the plurality of power switches. One or more of the gate drive units further comprise respective sensor modules that are connected to obtain, during operation of the power converter, measured values of at least one characteristic of the corresponding power switches. The power converter also includes at least one controller configured to determine health states of the power switches based on comparisons of the plurality of measured values to at least one standard value. In embodiments, the determined health states are used for controlling the power switches, as a basis for generating a signal indicating that one or more of the switches should be replaced, and/or the like.

"Health state" is used herein to refer to a state or condition of a power switch that provides an indication of whether the switch may need to be replaced (e.g., whether the switch has failed or is likely to fail within a designated time threshold).

DRAWINGS

The present invention will be better understood from reading the following description of non-limiting embodiments, with reference to the attached drawings, wherein below:

DETAILED DESCRIPTION

Figure 1:
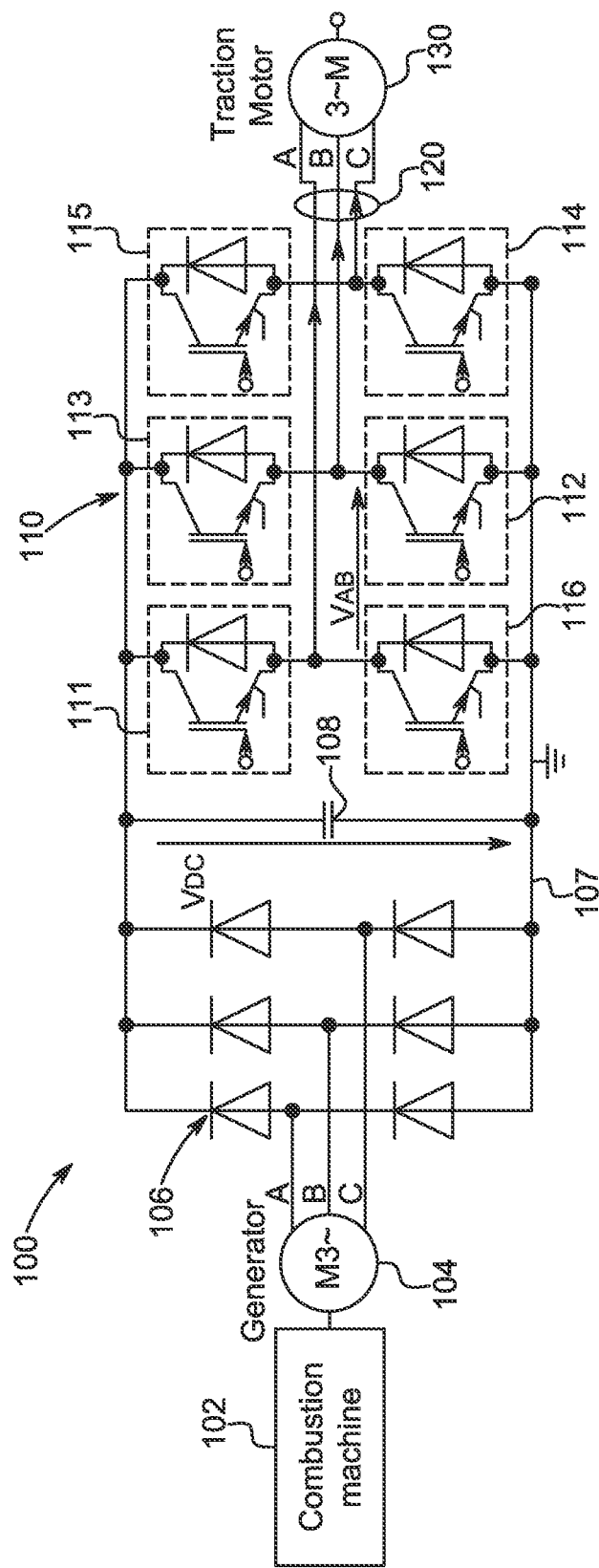
FIG. 1 is a schematic view of a diesel-electric traction system including a three-phase semiconductor power converter for use with a health monitoring system and method according to an embodiment of the present invention.

Reference will be made below in detail to exemplary embodiments of the invention, examples of which are illustrated in the accompanying drawings. Wherever possible, the same reference characters used throughout the drawings refer to the same or like parts. Although exemplary embodiments of the present invention are described with respect to power converters, embodiments of the invention are also applicable for use with power semiconductors generally.

Aspects of the invention relate to methods for monitoring health of power switches directly at the associated gate drive units. Embodiments of the invention relate to health monitoring gate drive units that monitor characteristics of the associated power switches, and compare the monitored characteristics to baseline values.

In embodiments, power converter and power switch characteristics are monitored directly at the gate drives of the power converter, using relatively minor additional hardware components (versus a power converter without such functionality) in conjunction with a digital gate drive platform. Additionally or alternatively, digital communications between the gate drives and a central controller allows for distributed measurement of health states and central collection of all information at the central controller. Health monitoring in this manner enables better utilization of the power switches, reduces risk of failures in operation, and simplifies scheduling for service and maintenance of power converters.

FIG. 1 shows in schematic view a diesel-electric traction system 100 that may be used with an embodiment of the inventive health monitoring apparatus and method. As shown, in the traction system 100 a combustion machine 102 drives a three-phase generator 104. AC voltage produced by the generator 104 is rectified by a three-phase diode array 106, which delivers voltage Vdc, via a DC link 107, to a capacitor 108 and a power inverter 110. The power inverter includes switch apparatus or "modules" 111, 112, 113, 114, 115, 116, which together commutate Vdc to deliver three-phase electrical power via output leads 120 to a traction motor 130. Each switch apparatus is controlled by an associated gate drive unit, as further discussed below with reference to FIG. 4.

It will be appreciated that the invention is not limited by the particular arrangement of the switch apparatus 111, 112, etc. to form a power inverter 110. Rather, the present invention is equally applicable in other embodiments, including, for example, a single switch module or an array of switch modules used for electrical power conversion. Thus, embodiments of the invention are applicable to power inverters (such as shown in FIG. 1) or other power converters, referring generally to devices configured to convert one power waveform to another, in a designated manner.

Figure 2:
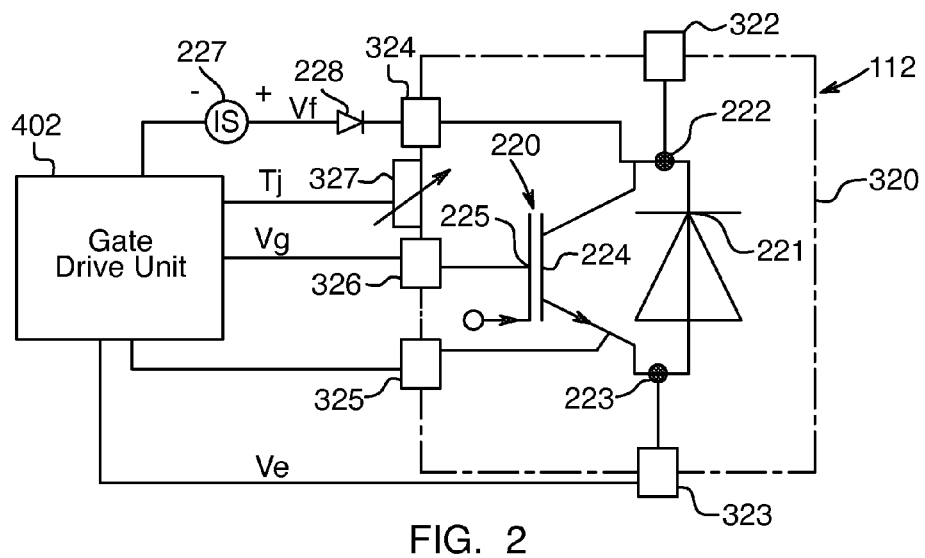
FIG. 2 is a schematic view of a switch apparatus of the power converter of FIG. 1 and a health monitoring system in accordance with an embodiment of the present invention.
Figure 3:
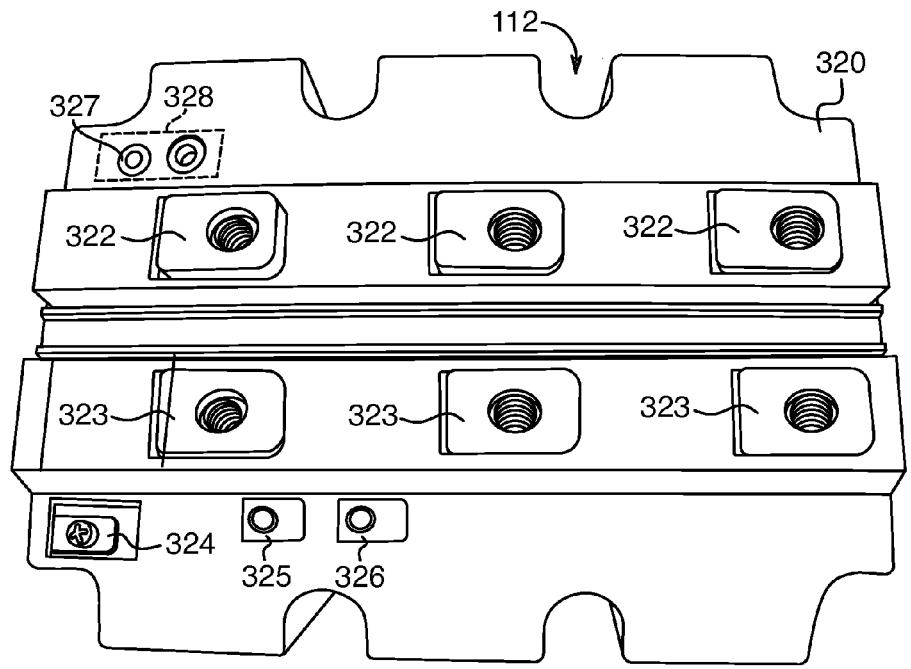
FIG. 3 is a perspective view of an exterior of the switch apparatus of FIG. 2.

FIG. 2 shows in schematic view the switch module 112, while FIG. 3 shows in perspective view a case 320 of the switch module 112. As shown in FIG. 2, the switch module 112 includes within its case 320 a voltage-controlled semiconductor power switch 220 and a free wheel diode 221. The power switch 220 has a collector 222 and an emitter 223 that are joined by a junction 224. At the junction 224, a gate 225 is connected to receive gate voltage Vg and gate current Ige from an associated gate drive unit 402. The free wheel diode 221 is connected anti-parallel to the power switch 220, in other words, the anode of the free wheel diode is connected to the power switch emitter 223 while the cathode of the free wheel diode is connected to the semiconductor collector 222.

Although FIG. 2 specifically illustrates an exemplary embodiment wherein the power switch is an isolated gate bipolar transistor (IGBT), the present invention is also applicable to other voltage-controlled semiconductor devices, including, by way of non-limiting examples, bi-mode isolated gate transistors, reverse-conducting IGBT, MOSFETs, or JFETs. Additionally, although FIG. 2 shows a freewheel diode, it will be appreciated that other devices or structures can be substituted for leading reverse current. Although FIG. 2 shows a switch module packaging both a power switch and a freewheel diode, these components could be separately packaged. By way of non-limiting example, several power switches could be packaged together in a switch module, while associated diodes could be packaged together in a diode module.

External to the switch module 112, the collector 222 is connected to one of the output leads 120 and to an electrically adjacent switch module 113, via a collector terminal 322 included in the switch module case 320. The emitter 223 is connected to the DC link 107 at the low side of the capacitor 108 and of the rectifier 106, via an emitter terminal 323 included in the switch module case 320.

In an embodiment, the gate drive unit 402 is connected to the power switch collector 222, emitter 223, and gate 225 via sense terminals 324 and 325, and control terminal 326, respectively, as further discussed below with reference to FIGS. 2-4. The gate drive unit 402 is also connected to a thermistor 327, which is mounted to the switch module case 320.

Referring to FIG. 3, the thermistor 327 is positioned to sense temperature Tc at the switch module case 320 proximate the power switch junction 224 (FIG. 2). Additionally, a first value Tj1 of power switch junction temperature can be sensed using a "virtual temperature sensor" that is supplying a current from the gate drive unit 402 into the power switch and measuring the resulting threshold voltage Vgeth at switch-on of the power switch, according to Vgeth=f(Tj1, Ige). Vgeth and Tj are further discussed below.

Based on the case temperature Tc, in combination with sampling of Vce and Ice, a second estimate of power switch junction temperature Tj2 can be obtained according to Tj2=Tc+Pload(Vce,Ice)*Rth. By comparison of Tj1 to Tj2 it is possible to estimate thermal resistance Rth from the power switch junction 224 to the switch module case 320; this estimated thermal resistance can be tracked to identify degradation of the power switch semiconductor structure, such as delamination.

In some aspects, the gate drive unit 402 can be configured to further estimate intermediate thermal resistances, Rth,jc and Rth,chs according to Rth=Rth,jc+Rth,chs. In such aspects Rth,jc is distinguished from Zth,jc (thermal impedance), where in the latter the effect of the thermal capacitances (of chips, solder layers, etc.) is big. Changes in Rth,jc would indicate delaminations. Changes in Rth,chs would reflect changes/aging in the thermal interface material between the power switch 112 and the switch module case 320. By monitoring the pair (Vce, Tc) at a time interval greater than a time constant of the junction-case thermal circuit, then Rth,jc can be obtained. For example, an appropriate time interval for a large (>1000 A) IGBT might be on the order of 500 ms.

Figures 4, 5:
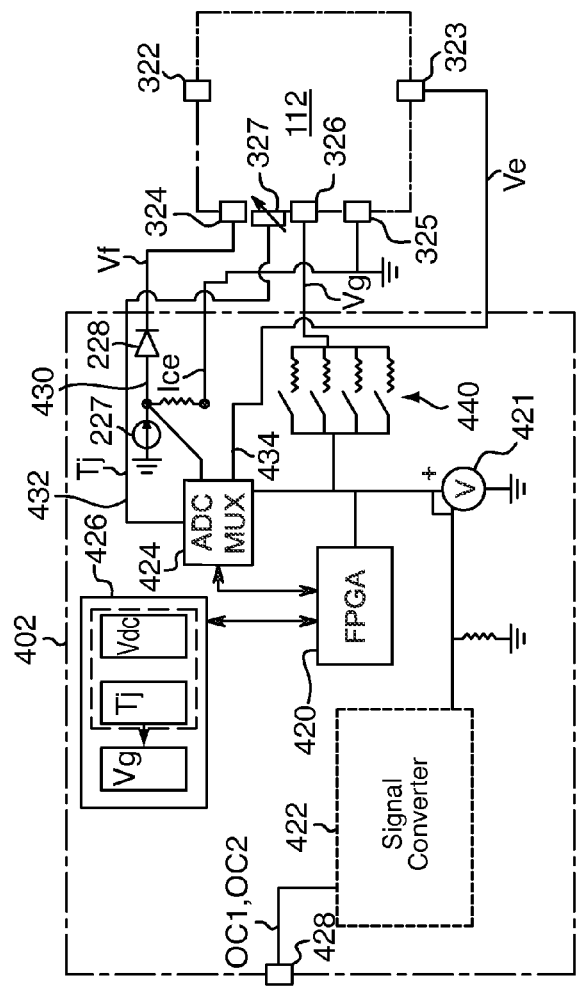
FIG. 4 is a schematic view of the health monitoring system of FIG. 2.
FIG. 5 illustrates health monitoring equations according to an embodiment of the present invention.

FIG. 4 shows in schematic view an exemplary gate drive unit 402, connected with the switch module 112, which is configured for health monitoring according to an embodiment of the present invention. The health monitoring gate drive unit 402 includes a programmable logic controller (PLC), which in one embodiment can be an FPGA 420 (field programmable gate array). The gate drive unit 402 also includes a DC power supply 421, a signal converter 422, a multiplexed (MUX) ADC (analog digital signal converter) 424, a memory 426, and several signal connections. In particular, the control/data signal connection 428 receives and transmits data including operator control signals OC1, OC2, etc., while the PLC 420 directly receives measured values of Vf, Tj, and Ve from sensor signal connections 430, 432, and 434 via the ADC 424.

At the health monitoring gate drive unit 402 that is connected with the power switch 220, one or more of plural characteristics can be measured for determining the health state of the power converter and/or of the power switch. Health states can be monitored by periodically re-determining the health states. According to one aspect of the present invention, these characteristics are compared with standard values which are determined at the first operation of the converter (during commissioning or pre-commissioning), determined at another time relatively soon after commissioning (such as after a burn-in period, or during bench testing other than at commissioning), or else given by the manufacturer. According to the embodiment shown in FIG. 4, the measured characteristics and/or the standard values are stored in the memory 426, which is incorporated into the health monitoring gate drive 402. Alternatively the measured characteristics and/or the standard values can be stored in a memory of a central controller 490, which is connected in communication with the health monitoring gate drive 402 via the control/data connection 428 ("central" means at least not part of the gate drive, such as a controller that controls plural gate drives of a converter).

In aspects of the present invention, a change in any measured characteristic of a power switch away from its standard value can be used as a basis for determining a health state of the power switch, for example an indication of power switch damage that can be used to predict that the switch will fail in the near future (e.g., that the power switch is more likely than not to fail within a designated time threshold). In another aspect, a drift in any measured characteristic of a power switch away from its standard value (drift referring to a change over time, e.g., by more than a designated threshold) can be used similarly. In either or both cases, such information is transmitted to the central controller 490 of the power converter, which then notifies an operator or other entity that the system requires maintenance and even can report which particular power switch of the plurality of power switches of the power converter needs to be replaced or repaired. This requires communication between the central controller 490 and the FPGA 420, via the control/data connection 428.

Several measured characteristics and their measurement points are shown in FIG. 2. From the measured characteristics, other more descriptive characteristics can be derived or estimated, as discussed below.

One characteristic that describes the converter health (and, more generally, which can be used to determine a health state of a power switch) is the commutation inductance Lcom. Lcom is the stray inductance of the whole commutation path when a power semiconductor is switched. In case of busbar delamination, loosening of connections, or capacitor damage, Lcom increases. Lcom is reflected in the inductive voltage drop at turn-on and in the voltage overshoot at turn-off, across each power switch. For the voltage overshoot at turn-off, also, the diode forward recovery may be considered. Vice and dIce/dt are measured at the gate drive and the commutation inductance is calculated according to the relation Lcom=deltaVce/dIce/dt.

Other characteristics that can describe the health states of individual power switches include forward voltage (Vf), threshold voltage (Vgeth), input capacity (Cge) and Miller capacity (Ccg), module inductance (Lmod), and thermal resistance between junction and case (Rthjc).

Lmod can be estimated by measuring between auxiliary and power emitter terminals of the power switch, during a known current change, to obtain the voltage drop Vlmod across the module inductance. The module inductance then can be determined according to Lmod=Vlmod/dIce/dt. Increasing Lmod may be indicative of debonding of the semiconductor device terminals.

The forward voltage Vf is the voltage drop across the power switch when it is conducting current. The general relation is Vf=f(Ice, Tj, Vge). In conduction mode Ice is equal to the phase output current which is usually measured for control reasons. Therefore the value of Ice is available at the central controller, such that Tj can be calculated from Vf.

In one embodiment, as shown in FIG. 2, Vf is measured with a current source 227 connected through a blocking diode 228 to the collector 222. The blocking diode 228 blocks the high DC link voltage when the power switch is turned-off. In the on-state, the voltage between the connection of the current source and the blocking diode, Vf, follows the collector-emitter voltage of the power switch. Vf rising above its baseline value may be indicative of delamination or other damage to the power switch.

Vgeth is the gate voltage threshold level when the power switch starts to conduct current, with the general relation Vgeth=Vgeth(TD=Vg(Ice≈0 A). The function Vgeth(Tj) is generally linear with a negative slope, and specific function parameters can be established by bench test at commissioning of an individual power switch. In one embodiment, the gate voltage is continuously sampled with an ADC, and the sample at beginning of current conduction is taken as Vgeth. In another embodiment, the gate voltage is sampled once when the power switch starts to conduct current. The time when the power switch begins to conduct current can be detected by a power switch current measurement or estimation. For example, Vgeth can be sampled during the turn-on event when the power current first exceeds a certain predefined level.

In another embodiment the slew rate of the power current can be measured and compared against a certain predefined level to detect the time when the power switch begins to conduct. When the power switch begins to conduct, the current slew rate is rising. For example, the power switch slew rate can be measured as the voltage drop across the power switch module internal stray inductance. Measurement of Vgeth can be useful for establishing Tj, and also for detecting delamination of semiconductor layers or debonding of the gate terminal.

Figure 6:
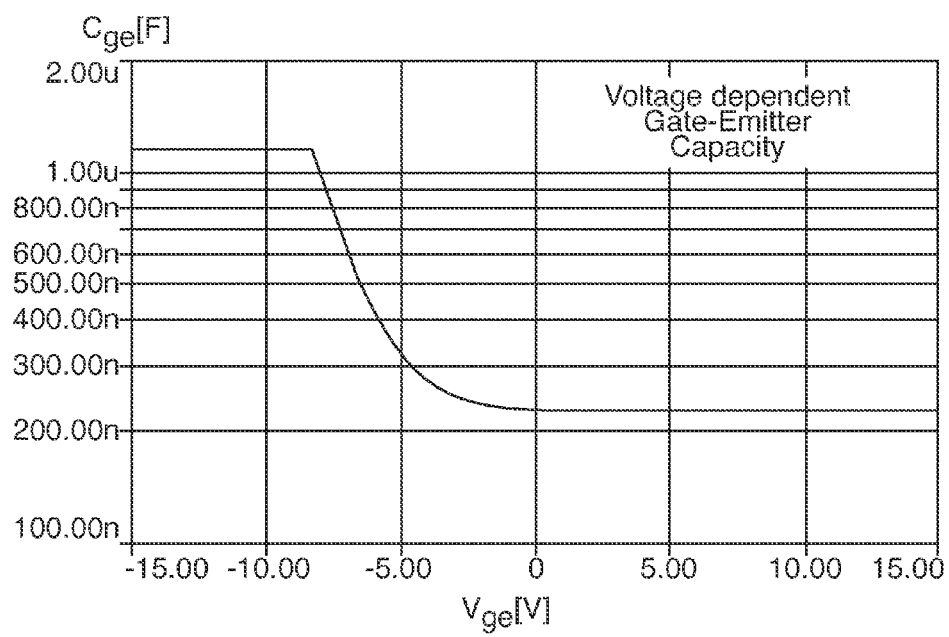
FIGS. 6 and 7 are graphs illustrating dependencies of power switch internal capacitance on gate voltages.
Figure 7:
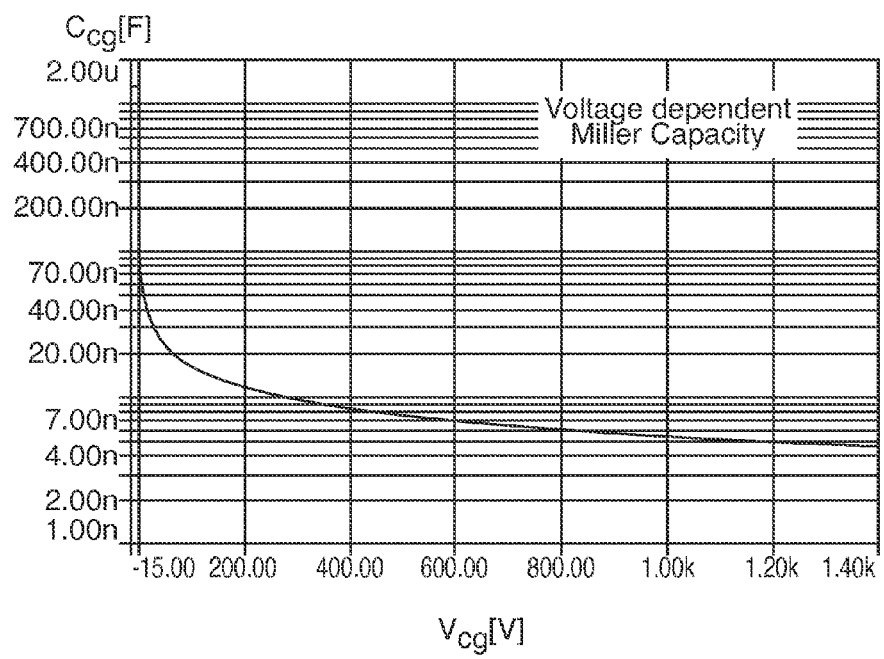

The input capacitance (Cge) between gate and emitter and the Miller capacitance (Cmiller or Ccg) are both charged and discharged through the gate at each switching event of the power switch. FIGS. 5, 6, and 7 show general relations of input and Miller capacitance with other electrical parameters. Changes of the capacitances from commissioning (standard or baseline) values can be useful for detecting delamination, or current channeling. For example, integration of the gate current Ige (see FIG. 5) during switch-ON or switch-OFF will give an estimate of charge at the gate, from which Cge can be obtained. Cge exhibits hysteresis or process dependency; thus, several baseline values of Cge, corresponding to various transients, can be stored in non-volatile memory (memory 426 or otherwise). Later, when a particular transient is repeated in normal operation, Cge can again be estimated and compared to the baseline value for that transient. Changes in Cge over time then indicate process-dependent changes in the capacitances of a power switch (between layers of the switch semiconductor). Using impedance spectroscopy, failure locations can be diagnosed to particular layers or interfaces within the power switch.

Figure 8:
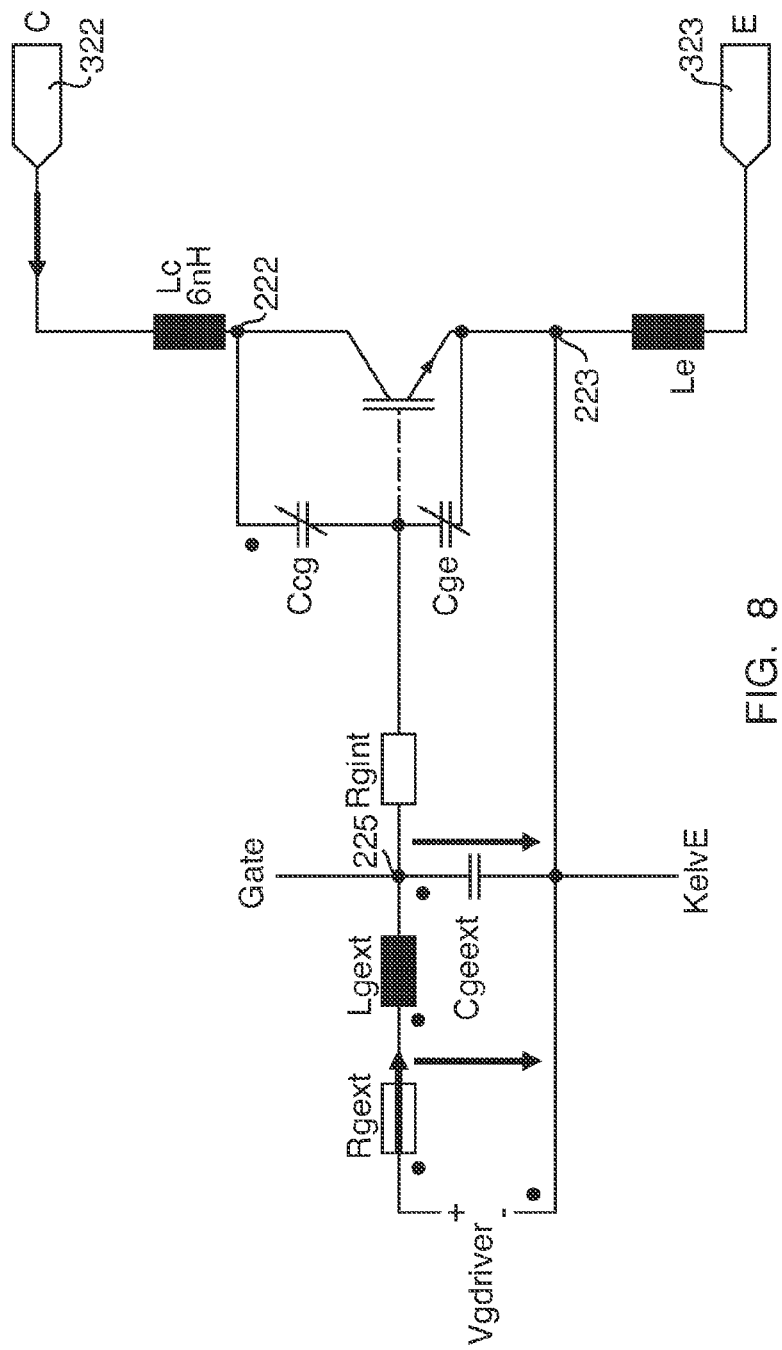
FIG. 8 is a schematic view of an equivalent circuit internal to a power switch in a state of good health.

FIG. 8 shows an exemplary equivalent circuit for selected internal inductances, resistances, and capacitances of a power switch. In FIG. 8, gate voltage Vg could be measured at the gate driver output.

As shown in FIG. 5, time integration of the gate current Ige when the power switch is turned-on or turned-off gives the total charge for the Miller and input capacitance. The gate voltage levels Vge_on and Vge_off are constant across the whole operation range, and are measured within the gate drive unit 402. Vgc_off is equal to the voltage on DC link 107, which can be easily measured. For the wiring shown in FIGS. 2 and 4, Vgc_on=Vge_on−Vf. A comparison of gate current integrals for same operation condition gives information about the power switch health state. In one embodiment only a fraction of the gate current integral is taken where only one capacitance is charged.

Rthjc, the thermal resistance from a semiconductor device junction to a switch module case, is another useful characteristic for monitoring power switch health state. Rthjc increases if layers of the power switch begin to delaminate, which can lead to thermal overload of the device. The basic relation is Rthjc=(Tj−Tc)/Ploss, where Ploss is determined in conduction mode as Ploss=Ice*Vice.

Figure 9:
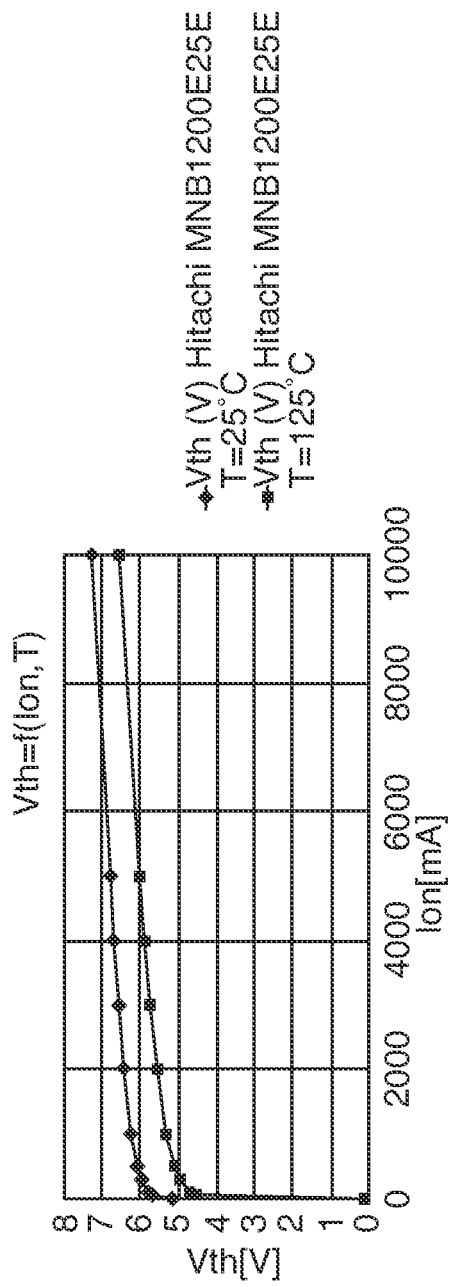
FIG. 9 illustrates an exemplary relationship of turn-on gate voltage to junction temperature for a particular type of power switch.

Tj can be estimated based on an empirical relationship established at power switch commissioning, for example, Tj=Tj(Vgeth), where Vgeth is characterized as a generally linear decreasing function of junction temperature. The Vgeth function parameters depend on the oxide layers and channel structure of the individual power switch. To avoid introduction of Tj error due to changes in oxide layer structure (e.g., delamination), Tj also can be measured by using a current source to drive Vgeth, during interlocking (zero current) periods. FIG. 9 shows an exemplary Vgeth(Tj) profile, for a Hitachi type IGBT of 2.5 kV blocking voltage and 1200 A nominal current. In example, Vgeth defined by 2000 mA driving current (=2 A) is 6.4 V at 25° C. and 5.6V at 125° C., thus illustrating the negative relationship of Vgeth to Tj.

For any of the measured or derived characteristics, a baseline/standard value is required to permit comparison for health monitoring. In one embodiment, standard values of monitored characteristics are obtained during pre-commissioning bench tests. The standard values then are stored in the memory 426 of the gate drive unit 402, and/or in a memory of the controller 490 remote from the gate drive unit. In another embodiment, one or more baseline/standard values are established during a routine test made when the converter is powered up or in idle state. In one aspect of the routine test, the power switches are switched according to a pre-defined schedule and the characteristics of the power switches and of the entire converter are measured and/or calculated. A comparison with standard (e.g., on-commissioning) values gives information about, and is used to determine, the health state of the converter and power switches. During operation, in embodiments, continuous or periodic measurements of selected characteristics then are compared to the baseline values for monitoring health of the power converter and of the power switches. Comparisons can be made within the controller of the gate drive unit (e.g., the PLC 420), or at the central controller 490.

In one embodiment of the invention, a health state of a power switch is determined by obtaining a standard value for a characteristic of the power switch (e.g., obtained from memory); obtaining a measured value of the characteristic, via a gate drive unit connected to provide gate voltage to the power switch; and comparing the measured value to the standard value of the characteristic. The measured value may be compared to the standard value within the gate drive unit, or within a controller separate from the gate drive unit. In certain aspects, the gate drive unit may periodically transmit a health monitoring signal to a central controller separate from the gate drive unit, e.g., the health monitoring signal containing information of the health state as periodically determined In some embodiments, the measured characteristics include Lcom (a stray inductance of a commutation path associated with the power switch when the power switch is switched on or off), which can be used for detecting terminal debonding. In some embodiments, the measured characteristic may include Rthjc (an estimated thermal resistance to heat transfer from the power switch junction to the power switch case), which can be used for detecting semiconductor delamination. In some embodiments, the measured characteristic may include Vf (a voltage drop across the power switch while the power switch is conducting) and/or Vgeth (a gate voltage threshold level when the power switch starts to conduct), which can be used for detecting gate oxide degradation. In some embodiments, the measured characteristic may include Cmiller, Ccg, or Cge (capacitances that can be used to isolate a fault location within the power switch). In some embodiments, the measured characteristic may include a parameter of a time function describing current through the power switch, e.g., switching current slew. Thus, in certain embodiments, a failure location may be reported based on repeated comparison, during a sequence of power transients, of the measured value of the characteristic to the standard value of the characteristic.

According to one embodiment, a gate drive unit includes an output stage configured to deliver gate voltage to a power switch, and a sensor module configured to obtain a measured value of a characteristic of the power switch. Additionally, a controller is configured to determine a health state of the power switch based on a comparison of the measured value to a standard value of the characteristic. For example, the characteristic may be include any of Lcom, Rthjc, Vf, Vgeth, Cmiller, Ccg, current slew, or Cge. The controller may be incorporated into the gate drive unit. Alternatively, the controller may be separate from the gate drive unit and configured to communicate with other gate drive units. In certain embodiments, the gate drive unit may be configured to periodically transmit a health monitoring signal to a central controller separate from the gate drive unit, e.g., the health monitoring signal containing information of the health state as periodically determined.

According to another embodiment, a power converter includes a plurality of power switches, and a plurality of gate drive units. The gate drive units include respective output stages connected to deliver gate voltages to the plurality of power switches, and sensor modules connected to obtain, during operation of the power converter, measured values of one or more characteristics of the power switches. For example, the one or more characteristics may be any one or more of Lcom, Rthjc, Vf, Vgeth, Cmiller, Ccg, current slew, or Cge. The power converter also includes at least one controller configured to determine respective health states of the power switches based on comparisons of the plurality of measured values to at least one standard value. In certain embodiments, a plurality of controllers may be provided, each controller incorporated into one of the plurality of gate drive units. In some embodiments, the at least one controller is configured to report a risk of power switch failure based on a determined health state. In other embodiments, the health state of the converter overall is monitored according to periodic determinations of the health states of the power switches.

In another embodiment, a method comprises monitoring respective health states of a plurality of power switches in a power converter, and communicating information of the health states to a recipient remote from the power converter (remote referring to a controller or other recipient not within the power converter, such as not within a housing of the converter). The step of monitoring the health states comprises obtaining from a memory unit one or more respective standard values for one or more characteristics of the power switches, periodically obtaining measured values of the one or more characteristics of the power switches during operation of the power converter, and periodically determining the health states based on comparisons of the measured values to the standard values. The information communicated to the remote recipient may identify one or more of the plurality of power switches to be repaired or replaced.

As will be readily appreciated, in aspects of the present invention, health states of one or more power switches can be continuously monitored during operation. (Although each determination of a health state takes a discrete amount of time, re-determining the health state as fast as possible, or re-determining the health state at relatively short intervals relative to expected power switch transients, results in in-effect continuous monitoring.) Therefore, it is possible to detect the imminent onset of a fault condition, and to proactively replace devices in danger of failure. At the same time it is possible to avert unnecessary equipment shutdowns for inspection or scheduled replacement of healthy devices. As a result, costs of operation and maintenance can be reduced.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §122, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described apparatus and method for power switch health monitoring, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method comprising:
   obtaining a standard value for a junction to case thermal resistance of a power switch;
   storing the standard value in at least one of a central controller or a gate drive unit connected in communication between a gate terminal of the power switch and the central controller;
   obtaining at the gate drive unit, during operation of the power switch, a measured value of the junction to case thermal resistance of the same power switch; and
   monitoring, in the gate drive unit or in the central controller, a health state of the power switch based on comparison of the measured value to the standard value of the junction to case thermal resistance;
   wherein the junction to case thermal resistances are obtained by comparison of gate threshold voltage to gate-emitter current and by comparison of collector-emitter voltage to collector-emitter current.

2. A method as claimed in claim 1, wherein the gate drive unit periodically transmits a health monitoring signal to the central controller separate from the gate drive unit, and wherein the health monitoring signal includes information of the health state.

3. A method as claimed in claim 1, wherein the measured value is compared to the standard value within the central controller separate from the gate drive unit.

4. A method as claimed in claim 1, further comprising reporting a failure location within the power switch based on repeated comparison, during a sequence of power transients, of the measured value of the characteristic to the standard value of the characteristic.

5. A method as claimed in claim 1, further comprising recommending replacement of the power switch, based on the determined health state of the power switch.

6. The method of claim 1, further comprising: estimating intermediate thermal resistances; and diagnosing a cause of a change in health state of the power switch, based on changes of the intermediate thermal resistances from baseline values.

7. A system comprising:
a gate drive unit comprising:
an output stage configured to deliver gate voltage and/or gate current to a power switch; and
a sensor module configured to obtain a measured value of a junction to case thermal resistance of the power switch during operation of the power switch; and
a controller configured to determine a health state of the power switch based on comparison of the measured value to a standard value of the junction to case thermal resistance previously stored in at least one of the gate drive unit or the controller;
wherein the junction to case thermal resistances are obtained by comparison of gate threshold voltage to gate-emitter current and by comparison of collector-emitter voltage to collector-emitter current.

8. A system as claimed in claim 7, wherein the controller is separate from the gate drive unit and is configured to communicate with other gate drive units.

9. A system as claimed in claim 7, wherein the controller is configured to periodically transmit a health monitoring signal to a different controller, and wherein the health monitoring signal includes information of the health state.

10. The system of claim 7, wherein the controller is further configured to estimate intermediate thermal resistances; and to diagnose a cause of a change in health state of the power switch, based on changes of the intermediate thermal resistances from baseline values.

11. A power converter comprising:
a plurality of power switches;
a plurality of gate drive units comprising:
output stages connected to deliver gate voltages and/or gate currents to the plurality of power switches; and
sensor modules connected to obtain, during operation of the power converter, measured values of junction to case thermal resistances of each of the plurality of power switches; and
at least one controller configured to determine health states of the power switches based on comparisons of the plurality of measured values to at least one standard value previously stored in at least one of the gate drive units or in the at least one controller;
wherein the junction to case thermal resistances are obtained by comparison of gate threshold voltage to gate-emitter current and by comparison of collector-emitter voltage to collector-emitter current.

12. A power converter as claimed in claim 11, wherein the at least one controller is configured to report a risk of power switch failure based on a determined health state.

13. The power converter of claim 11, wherein the controller is further configured to estimate intermediate thermal resistances; and to diagnose a cause of a change in health state of the power switch, based on changes of the intermediate thermal resistances from baseline values.

14. A method comprising:
monitoring respective health states of a plurality of power switches in a power converter; and
communicating information of the health states to a recipient remote from the power converter;
wherein the step of monitoring the health states comprises, in at least one of a gate drive unit in communication with a gate terminal of a power switch, or a central controller in communication with a plurality of gate drive units:
obtaining from a memory unit one or more respective standard values for junction to case thermal resistances of the power switches;
obtaining measured values of the junction to case thermal resistances of the power switches during operation of the power converter; and
determining the health states based on comparisons of the measured values to the standard values;
wherein the junction to case thermal resistances are obtained by comparison of gate threshold voltage to gate-emitter current and by comparison of collector-emitter voltage to collector-emitter current.

15. The method of claim 14, further comprising: estimating intermediate thermal resistances; and diagnosing a cause of a change in health state of the power switch, based on changes of the intermediate thermal resistances from baseline values.

* * * * *

UNITED STATES PATENT AND TRADEMARK OFFICE
CERTIFICATE OF CORRECTION

PATENT NO. : 8,957,723 B2  Page 1 of 1
APPLICATION NO. : 13/492947
DATED : February 17, 2015
INVENTOR(S) : Zoels et al.

It is certified that error appears in the above-identified patent and that said Letters Patent is hereby corrected as shown below:

In the Specification

In Column 6, Line 12, delete "Vice" and insert -- Vce --, therefor.

In Column 6, Line 45, delete "Vgeth=Vgeth(TD=" and insert -- Vgeth=Vgeth(Tj= --, therefor.

In Column 7, Line 44, delete "Ploss=Ice*Vice." and insert -- Ploss=Ice*Vce. --, therefor.

In Column 8, Line 27, delete "determined In" and insert -- determined. In --, therefor.

In the Claims

In Column 10, Line 60, in Claim 2, delete "A" and insert -- The --, therefor.

In Column 10, Line 65, in Claim 3, delete "A" and insert -- The --, therefor.

In Column 11, Line 1, in Claim 4, delete "A" and insert -- The --, therefor.

In Column 11, Line 6, in Claim 5, delete "A" and insert -- The --, therefor.

In Column 11, Line 30, in Claim 8, delete "A" and insert -- The --, therefor.

In Column 11, Line 33, in Claim 9, delete "A" and insert -- The --, therefor.

In Column 12, Line 13, in Claim 12, delete "A" and insert -- The --, therefor.

Signed and Sealed this
Twenty-fifth Day of August, 2015

Michelle K. Lee
*Director of the United States Patent and Trademark Office*